United States Patent
Lee et al.

(10) Patent No.: US 8,053,985 B2
(45) Date of Patent: Nov. 8, 2011

(54) ORGANIC ELECTROLUMINESCENT DEVICE AND METHOD OF MANUFACTURING THE SAME

(75) Inventors: Jong-Hyuk Lee, Yongin-si (KR);
Hae-Seung Lee, Seoul (KR);
Yoon-Hyeung Cho, Yongin-si (KR);
Won-Jong Kim, Seoul (KR); Jin-Woo Park, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 72 days.

(21) Appl. No.: 12/603,023

(22) Filed: Oct. 21, 2009

(65) Prior Publication Data

US 2010/0041298 A1    Feb. 18, 2010

Related U.S. Application Data

(62) Division of application No. 10/932,111, filed on Sep. 2, 2004, now Pat. No. 7,626,328.

(30) Foreign Application Priority Data

Sep. 3, 2003  (KR) .................................. 2003-61368

(51) Int. Cl.
*H01J 1/62* (2006.01)
*H01J 17/49* (2006.01)
*H01J 63/04* (2006.01)

(52) U.S. Cl. ................. 313/512; 445/1; 445/24; 445/25; 313/483; 313/500; 313/501; 313/502; 313/503; 313/504; 313/505; 313/506

(58) Field of Classification Search .................... None
See application file for complete search history.

(56) References Cited

U.S. PATENT DOCUMENTS

| | | | |
|---|---|---|---|
| 5,882,761 A | 3/1999 | Kawami et al. |
| 6,366,017 B1 | 4/2002 | Antoniadis et al. |
| 6,656,609 B2 | 12/2003 | Takahashi et al. |
| 6,800,350 B2 | 10/2004 | Van Hal et al. |
| 6,819,042 B2 | 11/2004 | Nakada et al. |
| 6,878,467 B2 | 4/2005 | Chung et al. |
| 6,887,592 B2 | 5/2005 | Hieda et al. |

(Continued)

FOREIGN PATENT DOCUMENTS

CN    1386391    12/2002

(Continued)

OTHER PUBLICATIONS

English machine translation of JP 2001-217068 (Ogawa et al).*

(Continued)

*Primary Examiner* — Natalie Walford
(74) *Attorney, Agent, or Firm* — H.C. Park & Associates, PLC

(57) ABSTRACT

An organic electroluminescent device and its method of manufacturing are provided. The organic electroluminescent device may include a rear substrate, an organic electroluminescent unit including a first electrode, an organic film, and a second electrode stacked on a surface of the rear substrate. It may also include a front substrate joined to the rear substrate to seal an internal space in which the organic electroluminescent unit is disposed. It may also include a porous oxide layer composed of a porous silica and a metal compound on a lower surface thereof. A device constructed according to the present invention may have excellent adsorption of moisture and oxygen, thereby increasing the life span of the device.

12 Claims, 5 Drawing Sheets

U.S. PATENT DOCUMENTS

| | | |
|---|---|---|
| 6,930,450 B2 | 8/2005 | Park et al. |
| 7,038,378 B2 | 5/2006 | Hayashi |
| 7,178,927 B2 | 2/2007 | Seo |
| 7,436,117 B2 | 10/2008 | Lee et al. |
| 2004/0201347 A1* | 10/2004 | Park et al. .................. 313/512 |
| 2005/0046338 A1 | 3/2005 | Park |
| 2005/0046345 A1 | 3/2005 | Park |
| 2005/0046348 A1 | 3/2005 | Lee et al. |
| 2005/0277355 A1 | 12/2005 | Choi et al. |
| 2006/0097633 A1 | 5/2006 | Cho et al. |
| 2006/0132034 A1 | 6/2006 | Cho et al. |

FOREIGN PATENT DOCUMENTS

| | | |
|---|---|---|
| CN | 1434665 | 8/2003 |
| JP | 07-169567 | 7/1995 |
| JP | 2001-217068 | 8/2001 |
| JP | 2002-216951 | 8/2002 |
| JP | 2002-280166 | 9/2002 |
| JP | 2003-163077 | 6/2003 |

OTHER PUBLICATIONS

Chinese Office Action dated Apr. 11, 2008.
Office Action dated Jul. 11, 2006 (for co-pending U.S. Appl. No. 10/932,111).
Office Action dated Jan. 22, 2007 (for co-pending U.S. Appl. No. 10/932,111).
Office Action dated Jul. 3, 2007 (for co-pending U.S. Appl. No. 10/932,111).
Office Action dated Jan. 18, 2008 (for co-pending U.S. Appl. No. 10/932,111).
Office Action dated Aug. 6, 2008 (for co-pending U.S. Appl. No. 10/932,111).
Office Action dated Feb. 5, 2009 (for co-pending U.S. Appl. No. 10/932,111).
Notice of Allowance dated Aug. 18, 2009 (for co-pending U.S. Appl. No. 10/932,111).
Certified Translation of JP2001-217068 (Ogawa et al.).

\* cited by examiner

ORGANIC ELECTROLUMINESCENT DEVICE AND METHOD OF MANUFACTURING THE SAME

CROSS-REFERENCE TO RELATED APPLICATIONS

This application is a divisional application of U.S. patent application Ser. No. 10/932,111, filed on Sep. 2, 2004, and claims priority to Korean Patent Application No. 2003-61368, filed on Sep. 3, 2003, in the Korean Intellectual Property Office, which are all incorporated herein by reference in their entirety.

BACKGROUND OF THE INVENTION

1. Field of the Invention

The present invention relates to an organic electroluminescent device and a method of manufacturing the same. More particularly, the present invention relates to an organic electroluminescent device including a porous oxide layer, with an extended life span due to an improvement in moisture and oxygen adsorption, and to a method of manufacturing the same.

2. Description of the Invention

Organic electroluminescent (EL) devices are self emission displays that emit light by recombination of electrons and holes in a thin layer made of a fluorescent or phosphorescent organic compound when current is applied to the thin layer. Organic EL devices have advantages such as lightweight, simple constitutional elements, ease of fabrication, superior image quality, and wide viewing angle. In addition, organic EL devices have electrical properties suitable for portable electronic equipment such as high quality dynamic images, high color purity, low power consumption, and low driving voltage.

However, organic EL devices are easily deteriorated by the entry of moisture. Therefore an encapsulation structure for preventing the entry of moisture is required.

Conventionally, a metal can or a glass substrate etched in the form of a cap with a groove is used for encapsulation. In such a case, for moisture adsorption, a desiccant of a powder type is mounted in the groove or a desiccant of a film type is adhered in the groove by means of a double-sided tape. However, the process of manufacturing with a powder-type desiccant is complicated, and material and process costs are high. In addition, the thickness of the substrate increases and substrates intended for encapsulation are not transparent, which renders front emission difficult. On the other hand, the film-type desiccant insufficiently prevents the entry of moisture and the desiccant may be easily broken during fabrication or use, thereby lowering durability and reliability, and rendering mass production difficult. In addition to the above problems, even though use of a metal can may ensure structural firmness, the etched glass is structural weak and may be easily damaged by external impact.

Japanese Patent Laid-Open Publication No. Hei. 9-148066 discusses an organic EL device including a laminate having a pair of electrodes opposite to each other and an organic light-emitting material layer made of an organic compound interposed between the electrodes, an airtight container for preventing exposure of the laminate to the air, and drying means made of, for example, alkaline metal oxide, disposed in the airtight container. However, the bulky shape of the airtight container increases the total thickness of the organic EL device. Also, opaqueness of the drying means renders the fabrication of a front emission type organic EL device difficult, even though the drying means is maintained in a solid state after adsorbing moisture. In addition, the fabrication process is complicated, increasing material and process costs.

SUMMARY OF THE INVENTION

The present invention provides an organic EL device with an improvement in the adsorption of moisture and oxygen, which can be used for front emission.

The present invention also provides a method of manufacturing the organic EL device.

According to an aspect of the present invention, there is provided an organic EL device comprising: a rear substrate; an organic EL unit comprising a first electrode, an organic film, and a second electrode stacked on a surface of the rear substrate; and a front substrate joined to the rear substrate to seal an internal space in which the organic EL unit is disposed and having a porous oxide layer composed of a porous silica and a metal compound on a lower surface thereof.

According to an aspect of the present invention, there is provided an organic electroluminescent device comprising: a rear substrate; an organic electroluminescent unit comprising a first electrode, an organic film, and a second electrode stacked on a surface of the rear substrate; and a front substrate joined to the rear substrate to seal an internal space in which the organic electroluminescent unit is disposed, using an sealant; a porous oxide layer composed of a porous oxide layer composed of a porous silica and a metal compound disposed in the internal space formed by the rear substrate and the front substrate.

The porous oxide layer is formed on an internal space of the rear substrate, lateral surfaces of the sealant, or at least one of the rear substrate or the front substrate.

According to another aspect of the present invention, there is provided a method of manufacturing an organic EL device, comprising: preparing a rear substrate having, on a surface thereof, an organic EL unit comprising a first electrode, an organic film, and a second electrode stacked; coating a composition for porous silica formation comprising a silicon alkoxide and a polar solvent on a lower surface of a front substrate followed by thermal treatment to form a porous silica layer; coating a sealant on at least a side of each of the rear substrate and the front substrate corresponding to outside the organic EL unit; and joining the rear substrate and the front substrate.

The composition for porous silica formation may further comprise alkaline metal salt, alkaline earth metal salt, metal halide, metal sulfate, and/or metal perchlorate.

The composition for porous silica formation may further comprise an acrylic resin as a stabilizer.

BRIEF DESCRIPTION OF THE DRAWINGS

The above and other features and advantages of the present invention will become more apparent in the following detailed description with reference to the attached drawings.

DETAILED DESCRIPTION OF THE INVENTION

The method of the present invention may include coating an upper surface of the porous silica layer with a composition including one or more selected from the group consisting of alkaline metal salt, alkaline earth metal salt, metal halide, metal sulfate, and metal perchlorate, and a solvent. Thus a layer made of, for example, alkaline metal oxide and/or oxide thereof, alkaline earth metal oxide and/or oxide thereof, metal halide and/or oxide thereof, metal sulfate and/or oxide thereof, and metal perchlorate and/or oxide thereof may be further formed on the porous silica layer. Alternatively, alkaline metal oxide, alkaline earth metal oxide, metal halide, metal sulfate, or metal perchlorate may be confined in a porous silica network.

The composition for silica formation may further include 0.1 to 0.9 moles of a catalyst for facilitating a hydrolysis reaction, for each mole of the silicon alkoxide. Moreover, the thermal treatment may be performed at a temperature of 100 to 550° C. Additionally, the silicon alkoxide may be tetramethylorthosilicate (TMOS) or tetraethylorthosilicate (TEOS).

The organic EL device of the present invention may include a porous oxide layer with excellent adsorption of moisture and oxygen. The porous oxide layer may be made of a porous silica layer and a metal compound layer with adsorption, or a porous silica network and a metal compound confined in the porous silica network. Thus the porous oxide layer can promote both physisorption and chemisorption, thereby increasing the adsorption of moisture and oxygen. In particular, in the case of the porous oxide layer composed of porous silica, silanol groups distributed in pore walls of the porous oxide layer play a role in the adsorption of moisture and oxygen. The present invention provides a method of manufacturing an organic EL device that includes a porous oxide layer composed of porous silica alone and having a thick thickness of 0.1 to 12 μm. According to this method, a thick film can be obtained without performing multi-coating, thereby ensuring a porous oxide layer uniformly coated on a wide area.

Figure 1A:
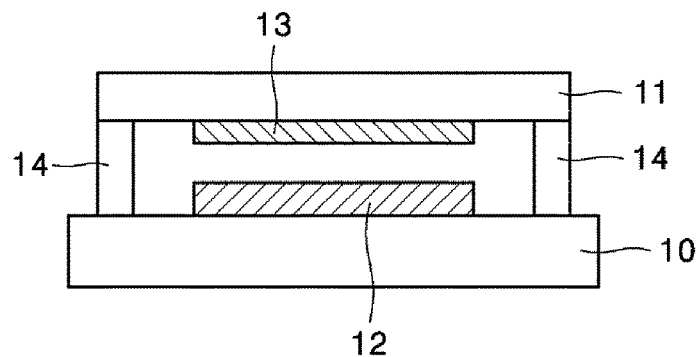
FIGS. 1A, 1B, and 1C are a schematic sectional view that illustrates an example of an organic EL device according to the present invention.

As shown in FIG. 1, an organic EL device may include a rear substrate 10 made of a glass or a transparent insulating material, an organic EL unit 12 including a first electrode, an organic film, and a second electrode stacked on a surface of the rear substrate 10, and a front substrate 11 joined to the rear substrate 10 to seal a space in which the organic EL unit 12 is disposed and having a porous oxide layer 13 on a lower surface thereof. The front substrate 11 and the rear substrate 10 are joined by a sealant 14 coated outside the organic EL unit 12.

Figure 1B:
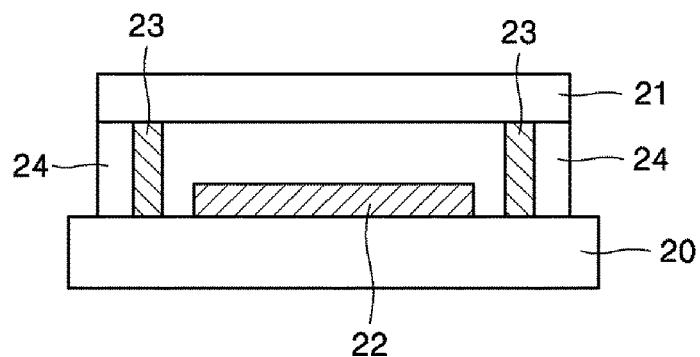

The front substrate 11 may also be called an encapsulating substrate, and may have a sealing capability in conjunction with the rear substrate 10 for the organic EL unit 12 disposed therebetween. The front substrate 11 may take form of an encapsulating substrate, as shown in FIG. 1B. Front substrates 21 and 31 shown in FIGS. 1B and 1C may also act as encapsulating substrates like front substrate 11 shown in FIG. 1A.

As shown in FIG. 1B, the organic EL device according to the present invention includes a rear substrate 20, the front substrate 21, an organic EL unit 22, and a porous oxide layer 23 formed on the lateral surface of the sealant 24.

Figure 1C:
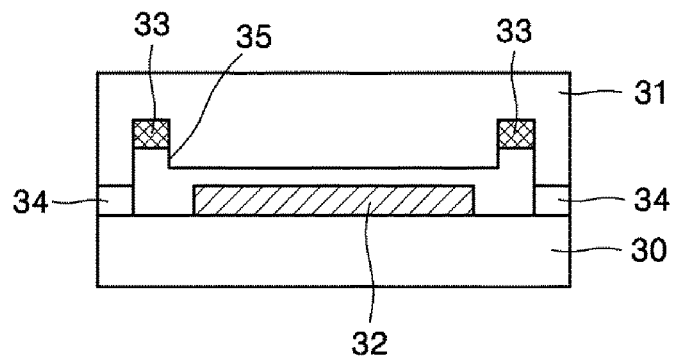

As shown in FIG. 1C, the organic EL device according to the present invention has a plurality of recesses 35 formed on one surface of the rear surface 31, that is, an encapsulating substrate, sealed with the front substrate 30 to form an internal space, and a porous oxide layer 33 is formed in the plurality of recesses 35. The device also includes an organic EL unit 32 and a sealant 34.

The organic EL unit 12 may be formed by deposition and has a stacked structure of a first electrode, an organic film, and a second electrode. The first electrode may be a cathode and the second electrode may be an anode. The organic film may include a hole injection layer, a hole transport layer, a light-emitting layer, an electron injection layer, and/or an electron transport layer.

The front substrate 11 may be made of an insulating material, for example, a glass or a transparent plastic material. The front substrate 11 (in this case made of a transparent plastic material) may be formed with a protective film on a lower surface thereof to prevent the entry of moisture. The protective film may be resistant to heat, chemicals, and humidity. The front substrate made of a transparent material can be used for front emission.

For rear emission, the organic EL unit 12 may have the first electrode made of a transparent material and the second electrode made of a reflective material. On the other hand, for front emission, the organic EL unit 12 may have the first electrode made of a reflective material and the second electrode made of a transparent material. The first electrode may be disposed near the rear substrate 10 and the second electrode may be disposed near the front substrate 11.

On an upper surface, the second electrode may have a protective film for planarization of organic EL unit 12 to provide resistance to heat, chemicals, and humidity. The protective film may be made of an inorganic material such as metal oxide or metal nitride.

The space defined by the front substrate 11 and the rear substrate 10 may be in a vacuum state or filled with an inert gas.

Preferably, the porous oxide layer 13 has a thickness of approximately 0.1 to about 12 μm. If the thickness of the porous oxide layer 13 is less than 0.1 μm, adsorption may be insufficient. On the other hand, if it exceeds 12 μm, the porous oxide layer may contact the cathode, and the area for moisture permeation may be increased.

The porous oxide layer may be composed of a porous silica and a metal compound. The metal compound may be one or more of the following: alkaline metal oxide, alkaline earth metal oxide, metal halide, metal sulfate, or metal perchlorate.

The porous oxide layer may have a two-layer structure including a porous silica layer and a metal compound layer, for example, a porous silica layer and a calcium oxide layer. The porous oxide layer may also be formed so that the metal compound is confined in a network of the porous silica.

In the porous oxide layer composed of the porous silica and the metal compound, the weight ratio of porous silica to metal compound may preferably be in a range of approximately 0.1:1 to about 1:1, but is not limited thereto.

The alkaline metal oxide may, for example, be lithium oxide ($Li_2O$), sodium oxide ($Na_2O$), or potassium oxide ($K_2O$), and the alkaline earth metal oxide may be barium oxide (BaO), calcium oxide (CaO), or magnesium oxide (MgO). The metal sulfate may, for example, be lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$). The metal halide may, for example, be calcium chloride ($CaCl_2$), magnesium chloride ($MgCl_2$), strontium chloride ($SrCl_2$), yttrium chloride ($YCl_2$), copper chloride ($CuCl_2$), cesium fluoride (CsF), tantalum fluoride (TaF$_5$), niobium fluoride (NbF$_5$), lithium bromide (LiBr), calcium bromide (CaBr$_3$), cerium bromide (CeBr$_4$), selenium bromide (SeBr$_2$), vanadium bromide (VBr$_2$), magnesium bromide (MgBr$_2$), barium iodide (BaI$_2$), or magnesium iodide (MgI$_2$). The metal perchlorate may, for example, be barium perchlorate (Ba(ClO$_4$)$_2$) or magnesium perchlorate (Mg(ClO$_4$)$_2$).

A method of manufacturing an organic EL device including the above-described porous oxide layer will now be described in detail. First, a first electrode, an organic film, and a second electrode may be stacked on a rear substrate to form an organic EL unit on the rear substrate. Then a composition including a silicon alkoxide and a polar solvent may be coated on a lower surface of a front substrate. This may be followed by thermal treatment to form a porous silica layer. The porous silica layer may be formed by hydrolysis of the silicon alkoxide, and dehydration and polycondensation of the hydrolyzed product.

During the thermal treatment, a polymer or an organic material may be removed and dehydration and polycondensation may occur. Preferably, the thermal treatment may be performed at a temperature of about 100 to approximately 550° C. If the temperature for the thermal treatment is less than 100° C., an organic material such as the solvent may remain in the porous silica layer. On the other hand, if it exceeds 550° C., a glass for a substrate may be deformed.

The composition for silica formation may be coated using a spin coating or screen printing process, but is not limited thereto.

The silicon alkoxide may be represented by Formula 1 below and may be TEOS, TMOS, or a mixture thereof:

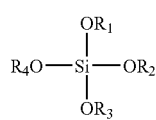

Formula 1

Wherein R$_1$, R$_2$, R$_3$, and R$_4$ are independently an alkyl group of C$_1$-C$_{20}$ or an aryl group of C$_6$-C$_{20}$.

The polar solvent for silica formation may be one or more selected from the group consisting of ethanol, methanol, butanol, isopropanol, methylethylketone, and pure water and may be used in an amount of 100 to 1,000 parts by weight, for each 100 parts by weight of the silicon alkoxide.

The composition for silica formation may further include a catalyst for facilitating a hydrolysis reaction, for example, nitric acid, hydrochloric acid, phosphoric acid, or sulfuric acid. The catalyst may be used in an amount of approximately 0.1 to about 0.9 moles, for each mole of the silicon alkoxide. If the content of the catalyst for facilitating a hydrolysis reaction is less than 0.1 moles, the process duration may increase. On the other hand, if it exceeds 0.9 moles, process control may be difficult.

The composition for silica formation may further include a metal compound, e.g., one or more of the following: alkaline metal salt, alkaline earth metal salt, metal halide, metal sulfate, or metal perchlorate. Here, the metal compound may be used in an amount of approximately 0.1 to about 0.5 moles, for each mole of silicon alkoxide.

Due to the addition of the metal compound such as alkaline metal salt and alkaline earth metal salt to the composition for silica formation, an obtained porous oxide layer may be formed such that the metal compound with adsorption may be confined in a porous silica network, or may have a multi-layer structure including a porous silica layer and a metal compound layer. Thus excellent adsorption of moisture and oxygen can be ensured.

The alkaline metal salt may be a precursor of alkaline metal oxide, and may be potassium acetate, potassium nitrate, sodium acetate, or sodium nitrate. The alkaline earth metal salt may be calcium acetate, calcium nitrate, barium acetate, or barium nitrate. Examples of the metal halide, the metal sulfate, and the metal perchlorate are as described above.

The composition for silica formation may further include a stabilizer such as a water-soluble acrylic resin. The stabilizer may be used in an amount of approximately 0.001 to about 50 parts by weight, for each 100 parts by weight of the silicon alkoxide.

After forming the porous silica layer, a composition including a metal compound and a solvent may be coated on the porous silica layer and then thermally treated. Here, the metal compound may be one or more of the following: alkaline metal salt, alkaline earth metal salt, metal halide, metal sulfate, or metal perchlorate. A metal halide such as CaCl$_2$ with very excellent adsorption may be used herein.

After the thermal treatment, a two-layer structure including a porous silica layer and a metal compound layer may be obtained, or a single-layer structure in which the metal compound is confined in a network of the porous silica layer may be obtained.

The solvent may be water, methoxyethanol, methanol, ethanol, or butanol and may be used in an amount of approximately 100 to about 1,000 parts by weight, for each 100 parts by weight of the metal compound. The thermal treatment may be performed at a temperature of approximately 100 to about 550° C.

The porous oxide layer thus formed may be a thick film with a thickness of approximately 0.1 to about 12 μm, and may be capable of sufficient adsorption of moisture and oxygen, thereby providing an excellent sealing property for an organic EL device.

After preparing the front substrate with the porous oxide layer as described above, a sealant may be coated on (or otherwise applied to) at least a side of each of the front substrate and the rear substrate corresponding to outside the organic EL unit, using a screen printer or a dispenser. Then the rear substrate and the front substrate may be joined to complete an organic EL device of the present invention.

An inner space of the organic EL device thus manufactured may be in a vacuum state or filled with an inert gas. Also, after the joining, the sealant may be cured by UV light, visible light, or heat (or any other suitable means).

The porous silica layer formed as described above is shown in FIG. 2.

Figure 2:
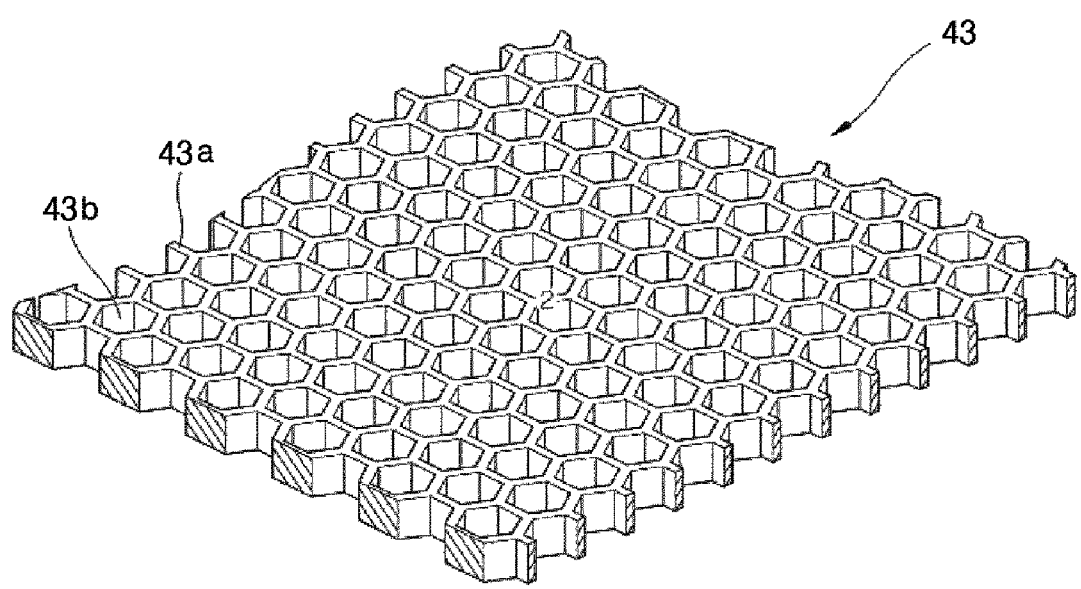
FIG. 2 is a perspective view of a porous silica layer used in an organic EL device according to the present invention.

As shown in FIG. 2, a porous silica layer 43 may include a silica frame 43a and a plurality of adsorption holes 43b. The silica frame 43a may serve to maintain the structure of the porous silica layer 43. Similarly, the adsorption holes 43b may serve to adsorb moisture. The porous silica layer 43 may be transparent before and after moisture adsorption.

The adsorption holes have a diameter of approximately 0.5 to about 100 nm, preferably approximately 10 to about 30 nm. Formation of the adsorption holes with a diameter of less than 0.5 nm may be difficult. On the other hand, adsorption holes with a diameter of greater than 100 nm may provide insufficient adsorption.

An organic EL device of the present invention can be used for front emission, rear emission, or bidirectional emission, depending on the material used for the porous oxide layer. In detail, when the porous oxide layer is kept transparent before and after moisture adsorption, e.g., when the porous oxide layer is composed of a transparent porous silica, an organic EL device of the present invention can be used for front emission. On the other hand, when the porous oxide layer is kept opaque before and after moisture adsorption, an organic EL device of the present invention can be used for rear emission.

There are no particular limitations on a driving method for an organic EL device of the present invention. Both passive matrix (PM) driving and active matrix (AM) driving are possible.

The following are several examples. They are not intended to serve to limit the scope of the invention but to assist the reader in understanding how to achieve the advantages and benefits of the invention.

Example 1

Ammonia water ($NH_4OH$) was added to 30 g of $H_2O$ to adjust the pH of a resultant solution to 10. 10 g of TEOS was then added thereto and stirred at an elevated temperature for 3 hours or more. Nitric acid was added to a resultant mixture to adjust the pH of the resultant mixture to about 0.5 to 1.0.

1 g of a water-soluble acrylic resin solution (30 wt %) was added to the mixture and stirred to obtain a uniform solution.

The uniform solution was coated on a soda glass substrate that was rotating at 180 rpm for 120 seconds. Next it was dried in a drying oven for about 2 minutes to remove residual solvent. The resultant product was calcined at 500° C. for 30 minutes to form a porous silica layer.

After cleaning the soda glass substrate with the porous silica layer, a sealant was coated onto at least a side of the glass substrate with the porous silica layer and at least a side of a glass substrate with a first electrode, an organic film, and a second electrode. Then both the glass substrates were joined to complete an organic EL device.

Example 2

In this example, 10 g of TEOS was added to a mixture of 30 g of $H_2O$ and 10 g of EtOH and was stirred for more than 30 minutes to carry out hydrolysis. Then 5 g of $CaCl_2$ was added to a resultant mixture and dissolved to prepare a composition for porous silica formation.

The composition was coated on a soda glass substrate that was rotated at 180 rpm for 120 seconds. It was then dried in a drying oven for about 2 minutes to remove residual solvent. The resultant was calcined at 500° C. to form a porous oxide layer.

The glass substrate with the porous oxide layer was cleaned. Then a sealant was coated on at least a side of the glass substrate with the porous oxide layer and at least a side of a glass substrate with a first electrode, an organic film, and a second electrode. Then both the glass substrates were joined to complete an organic EL device.

Example 3

An organic EL device was completed in the same manner as in Example 2 except that 5 g of LiBr instead of $CaCl_2$ was added to the composition for porous silica formation.

Example 4

$NH_4OH$ was added to 30 g of $H_2O$ to adjust the pH of a resultant solution to 10. 10 g of TEOS was then added thereto and stirred with heating for 3 hours or more. Nitric acid was added to a resultant mixture to adjust the pH of the resultant mixture to about 0.5 to 1.0.

1 g of a water-soluble acrylic resin solution (30 wt %) was added to the mixture and stirred to obtain a uniform solution.

The uniform solution was coated on a soda glass substrate that was rotated at 180 rpm for 120 seconds. It was then dried in a drying oven for about 2 minutes to remove residual solvent. The resultant product was calcined at 500° C. for 30 minutes to form a porous silica layer.

Then a mixture of 40 g of $CaCl_2$ and 60 g of water was coated on the porous silica layer and thermally treated to form a porous oxide layer in which $CaCl_2$ was infiltrated in the porous silica layer.

After cleaning the glass substrate with the porous oxide layer, a sealant was coated onto at least a side of the glass substrate with the porous oxide layer and at least a side of a glass substrate with a first electrode, an organic film, and a second electrode. Then both the glass substrates were joined to complete an organic EL device.

Comparative Example 1

An organic EL device was completed in the same manner as in Example 1 except that the porous silica layer was not formed on the soda glass substrate.

Figure 4:
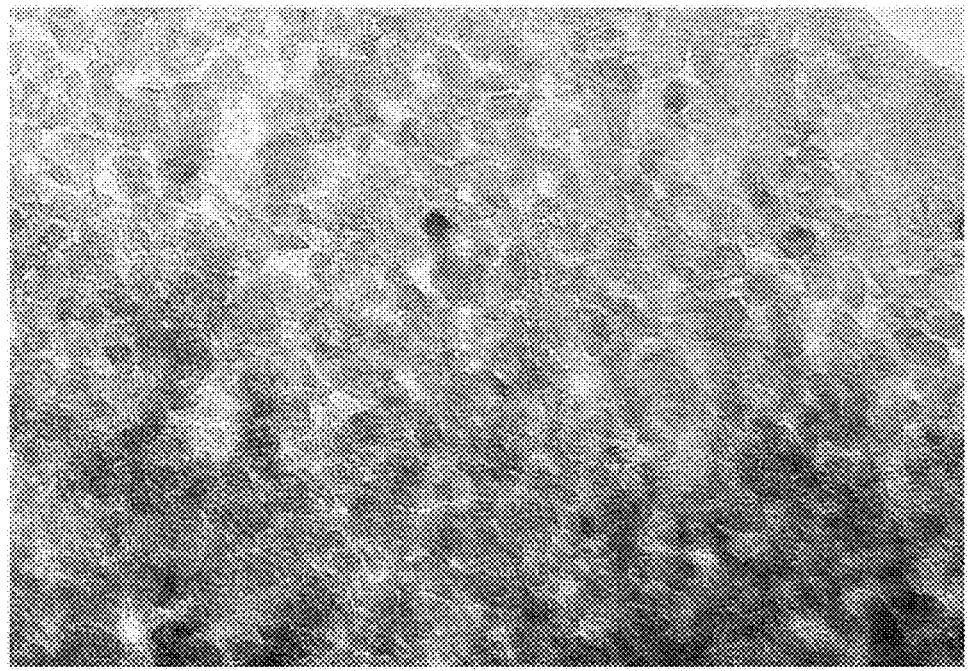
FIG. 4 is a transmission electron microphotograph (TEM) of the microstructure of a porous silica layer in the organic EL device according to Example 1 of the present invention.

The porous silica layer according to Example 1 exhibited excellent film characteristics such as a thickness of about 6.5 μm, a refractive index of 1.25, and porosity of about 50%. Also, the porous silica layer was transparent and had no defects such as cracks. These results can be easily identified by the transmission electron microphotograph (TEM) of the microstructure of the porous silica layer of Example 1 shown in FIG. 4.

Figure 3:
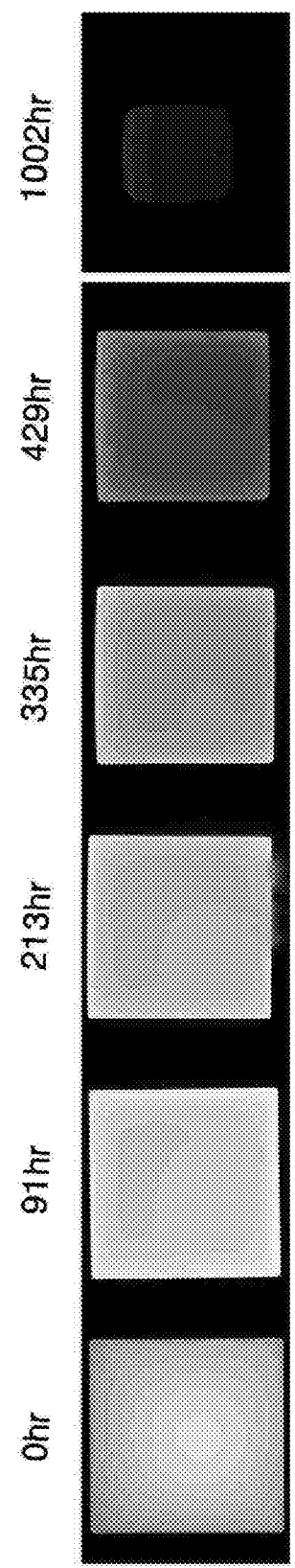
FIG. 3 is a microphotograph showing luminance reduction and dark spot or pixel shrinkage with time in an organic EL device according to Example 1 of the present invention.
Figure 5:
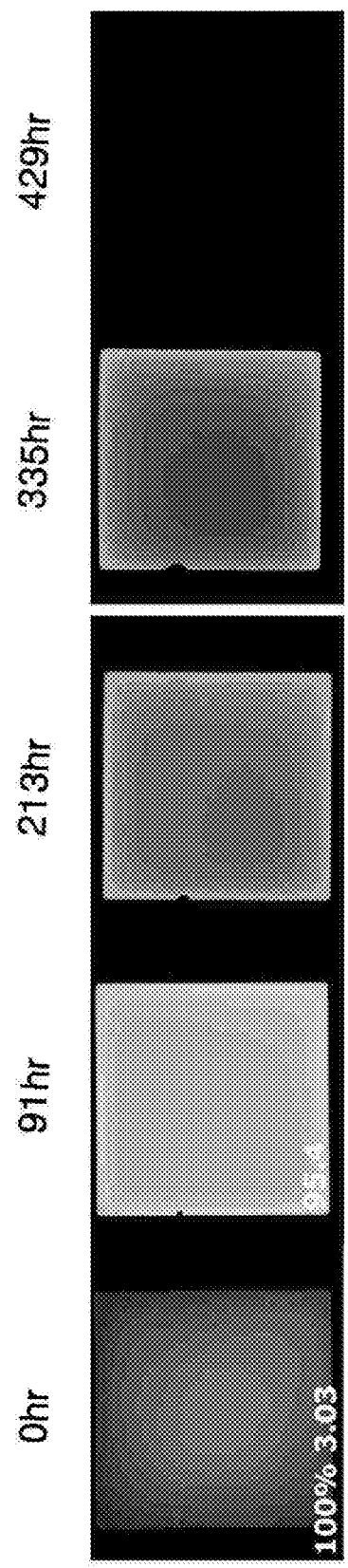
FIG. 5 is a microphotograph showing luminance reduction and dark spot or pixel shrinkage with time in an organic EL device according to Comparative Example 1.

The images of the organic EL devices according to Example 1 and Comparative Example 1 were observed using a microscope at 70° C., 90% RH with time, and the results are shown in FIGS. 3 and 5.

As shown in FIGS. 3 and 5, the organic EL device according to Example 1 exhibited remarkably enhanced life span characteristics, relative to the organic EL device according to Comparative Example 1.

The organic EL devices according to Examples 2-4 exhibited life span characteristics similar to those in Example 1.

An organic EL device of the present invention provides the following advantages.

First, an unetched flat glass can be used instead of an etched glass as a front substrate. Thus structural weakness (in terms of fracture properties) caused by using the etched glass can be overcome.

Second, a front substrate has a porous oxide layer that adsorbs moisture and oxygen on a lower surface thereof. Thus there is no need to use a separate desiccant material. Also, the organic EL device can be used for front emission, rear emission, or both-direction emission, according to a material used for the porous oxide layer.

Third, just one coating can ensure easy formation of the porous oxide layer uniformly coated on a wide area, as compared to a conventional sol-gel method for thick film formation. Thus the porous oxide layer has excellent adsorption of moisture and oxygen.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic electroluminescent device, comprising:
    forming an organic electroluminescent (EL) unit comprising a first electrode, an organic film, and a second electrode;
    coating a composition comprising a silicon alkoxide and a polar solvent onto a surface of a second substrate that will be an interior surface followed by thermal treatment to form a porous silica layer;
    coating a sealant onto at least a side of each of a first substrate and the second substrate corresponding to outside the organic EL unit; and
    joining the first substrate and the second substrate.

2. The method of claim 1, wherein the composition of the coating step further comprises one or more selected from the group consisting of alkaline metal salt, alkaline earth metal salt, metal halide, metal sulfate, and metal perchlorate.

3. The method of claim 2,
    wherein the alkaline metal salt comprises one or more selected from the group consisting of potassium acetate, potassium nitrate, sodium acetate, and sodium nitrate;
    wherein the alkaline earth metal salt comprises one or more selected from the group consisting of calcium acetate, calcium nitrate, barium acetate, and barium nitrate;
    wherein the metal sulfate comprises one or more selected from the group consisting of $Li_2SO_4$, $Nai_2SO_4$, $CaSO_4$, $MgSO_4$, $CoSO_4$, $Ga_2(SO_4)_3$, $Ti(SO_4)_2$, and $NiSO_4$;
    the metal halide comprises one or more selected from the group consisting of $CaCl_2$, $MgCl_2$, $SrCl_2$, $YCl_2$, $CuCl_2$, $CsF$, $TaF_5$, $NbF_5$, $LiBr$, $CaBr_3$, $CeBr_4$, $SeBr_2$, $VBr_2$, $MgBr_2$, $BaI_2$, or $MgI_2$, and the metal perchlorate is $Ba(ClO_4)_2$, and $Mg(ClO_4)_2$.

4. The method of claim 1, wherein the composition of the coating step further comprises an acrylic resin.

5. The method of claim 1, further comprising after the step of coating a composition, coating on the porous silica layer a solvent and a second composition comprising one or more selected from the group consisting of alkaline metal salt, alkaline earth metal salt, metal halide, metal sulfate, and metal perchlorate.

6. The method of claim 1, further comprising after the step of coating the composition, coating a third composition comprising a metal halide and a solvent on the porous silica layer.

7. The method of claim 6, wherein the metal halide comprises one or more material selected from the group consisting of $CaCl_2$, $MgCl_2$, $SrCl_2$, $YCl_2$, $CuCl_2$, $CsF$, $TaF_5$, $NbF_5$, $LiBr$, $CaBr_3$, $CeBr_4$, $SeBr_2$, $VBr_2$, $MgBr_2$, $BaI_2$, and $MgI_2$.

8. The method of claim 1, wherein the silicon alkoxide comprises one or more selected from the group consisting of tetraethylorthosilicate and tetramethylorthosilicate.

9. The method of claim 1, wherein the composition of the coating step further comprises about 0.1 to about 0.9 moles of a catalyst for facilitating a hydrolysis reaction, for each mole of the silicon alkoxide.

10. The method of claim 1, wherein the thermal treatment is performed at a temperature of about 100 to about 550° C.

11. The method of claim 1, wherein the porous silica layer comprises a silica frame and a plurality of absorption holes.

12. The method of claim 1, wherein the porous silica layer has a thickness in the range of 0.1 to 12 μm.

* * * * *